United States Patent [19]

Levy et al.

[11] Patent Number: 4,733,291
[45] Date of Patent: Mar. 22, 1988

[54] CONTACT VIAS IN SEMICONDUCTOR DEVICES

[75] Inventors: Roland A. Levy, Berkeley Heights; Kurt Nassau, Bernardsville, both of N.J.

[73] Assignee: American Telephone and Telegraph Company, AT&T Bell Laboratories, Murray Hill, N.J.

[21] Appl. No.: 798,422

[22] Filed: Nov. 15, 1985

[51] Int. Cl.⁴ ..................... H01L 23/48; H01L 29/44; H01L 29/60
[52] U.S. Cl. .................................. 357/68; 357/23.3; 357/52; 357/54; 148/DIG. 133
[58] Field of Search ........... 357/23.3; 148/DIG. 133; 357/52, 54, 68, 65, 71, 52 C, 54 G

[56] References Cited

U.S. PATENT DOCUMENTS 3,925,572 12/1975 Naber .................. 148/DIG. 133 X
4,192,059 3/1980 Khan et al. ........... 148/DIG. 133 X
4,535,528 8/1985 Chen et al. ........... 148/DIG. 133 X
4,644,386 2/1987 Nishizawa et al. ................ 357/23.3

Primary Examiner—Andrew J. James
Assistant Examiner—Sara W. Crane
Attorney, Agent, or Firm—Lucian C. Canepa

[57] ABSTRACT

A glass reflow step to round off sharp edges of contact vias is typically included in processes for making integrated-circuit devices. In the course of making such devices with closely spaced vias, it has been found that unacceptable overhangs occur on the sidewalls of the vias. Neither changes in the composition of the glass nor modifications in the processing parameters of reflow were effective to avoid the overhang phenomenon. In accordance with the invention, it has been discovered that the overhang problem can be consistently avoided if the ratio of glass thickness to via-to-via spacing is about $\leq 0.393$.

6 Claims, 5 Drawing Figures

CONTACT VIAS IN SEMICONDUCTOR DEVICES

BACKGROUND OF THE INVENTION

This invention relates to microminiature devices and, more particularly, to very-large-scale-integrated (VLSI) semiconductor devices that include a dielectric layer having closely spaced-apart contact vias formed therein.

Layers of glass such as phosphosilicate or borophosphosilicate glass are commonly utilized as dielectric materials in VLSI devices. After being deposited on a partially fabricated device, such a layer is typically planarized by heating the glass to cause it to flow. Contact vias or holes are then etched through the glass layer. Subsequently, a conductive pattern is formed on the planar top surface of the glass layer and in the vias to selectively connect the pattern to those portions of the device structure that directly underlie the vias.

In typical fabrication sequences, contact vias formed in glass layers by techniques such as reactive sputter (or ion) etching exhibit very steep (near-vertical) sidewalls. Covering the sharp edges defined by the planar top surface of the glass layer and the steep via sidewalls with a continuous and uniform layer of conductive material is a challenging requirement. To facilitate such coverage, it is common practice to reflow the apertured glass layer before depositing conductive material thereon. Such reflow of the glass rounds off the aforementioned sharp edges and decreases the steepness of the sidewalls. Reflow thus ensures that subsequently deposited conductive material will make reliable electrical connections from the top surface of the glass layer through the vias to underlying portions of the device structure.

In the course of fabricating VLSI devices with closely spaced vias formed in a glass layer, sidewall overhang in the vias was observed. Such overhang (that is, bulging and, as a result, formation of a re-entrant angle at the base of a via) threatened to prevent proper contact from being achieved in the vias and, moreover, threatened to prevent the maintenance of prescribed design rules in VLSI device structures.

Attempts by workers skilled in the art to solve the overhang problem included altering the composition of the glass layer. Additionally, the parameters of the reflow process were changed. But neither approach alone or in combination succeeded in preventing the overhang phenomenon from occurring.

Accordingly, efforts have continued by workers skilled in the art directed at trying to solve the overhang problem. It was recognized that such efforts, if successful, had the potential for contributing significantly to the realization of highly reliably VLSI devices.

SUMMARY OF THE INVENTION

Hence, an object of the present invention is to provide improved microminiature devices. More specifically, an object of this invention is to improve VLSI devices of the type that include a dielectric layer having closely spaced-apart contact vias formed therein.

Briefly, these and other objects of the present invention are realized in a specific illustrative VLSI device embodiment in which closely spaced contact vias with no overhangs are formed in a reflowed glass layer. Consistent achievement of such a device is based on the discovery that via overhangs will not occur as a result of reflow if the ratio of glass thickness to via-to-via spacing is established to be approximately equal to or less than 0.393. Thus, to achieve desired via features in a VLSI device, it is necessary, in accordance with the principles of the present invention, to reduce the thickness of the glass layer when the spacing between vias is reduced below a specified value.

BRIEF DESCRIPTION OF THE DRAWING

A complete understanding of the present invention and of the above and other objects and features thereof may be gained from a consideration of the following detailed description presented hereinbelow in connection with the accompanying drawing, not drawn to scale, in which.

DETAILED DESCRIPTION

Figure 1:
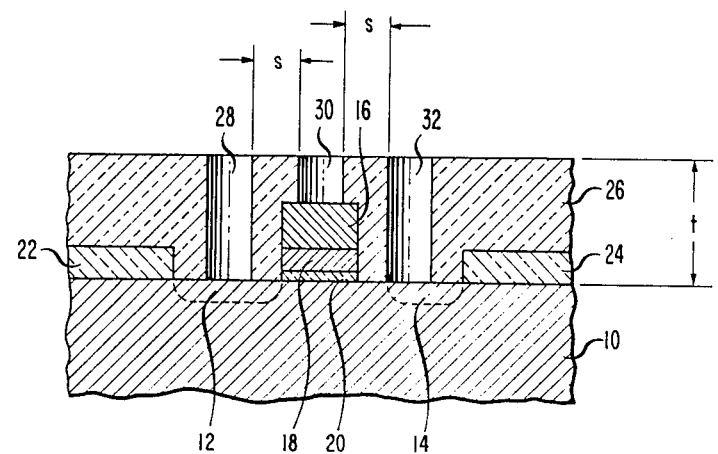
FIG. 1 schematically depicts in idealized form a particular illustrative VLSI device to which the principles of the present invention are applicable.

The particular illustrative VLSI device schematically represented in FIG. 1 is of the conventional metal-oxide-semiconductor (MOS) type. The illustrative device includes a silicon body 10 having standard source and drain regions 12 and 14 formed therein. A conventional gate electrode comprising, for example, a metallic silicide layer 16 and a doped polysilicon layer 18 overlies the top surface of the body 10 and is insulated therefrom by a relatively thin gate-oxide layer 20 made of silicon dioxide. (Metallic gate electrodes made, for example, of tungsten or molybdenum are also feasible.)

The device represented in FIG. 1 also includes conventional so-called field-oxide portions 22 and 24 made of silicon dioxide. Additionally, a relatively thick dielectric layer 26 made, for example, of a glass material such as phosphosilicate glass, borophosphosilicate glass, germanophosphosilicate glass or arsenophosphosilicate glass covers the entire top surface of the depicted device structure. In FIG. 1, the maximum thickness of the glass layer 26 is designated t.

As is well known, the glass layer 26 of FIG. 1 is typically heated after being deposited on the device structure. During this heating step, the glass layer flows and assumes a substantially planar top surface, as indicated in FIG. 1.

Subsequently, in standard ways such as by reactive ion (or sputter) etching, vias or through-holes are formed in selected portions of the glass layer 26. Three such vias 28, 30 and 32 are shown in FIG. 1. Through these vias, conductive interconnects will be established between a conductive pattern (not shown) defined on the top surface of the layer 26 and respective underlying portions of the device structure. In FIG. 1, the vias 28 and 32 provide access for conductive connections to the source and drain regions 12 and 14, and the via 30 provides access for connection to the depicted gate electrode. In FIG. 1, the smallest via-to-via spacing is designated s.

In practice, the vias 28, 30 and 32 included in the herein-specified typical VLSI device exhibit vertical or near-vertical sidewalls, as indicated in FIG. 1. To ensure adequate coverage of these sidewalls and of the sharp upper edges of the vias by a subsequently deposited conductive material, it is usually advantageous to heat the device structure to cause the glass layer 26 to flow again. As a result of this second heating or reflow step, the contour of the via sidewalls is modified and the aforementioned sharp edges are rounded off, in the particular way discussed in detail later below.

Figure 2:
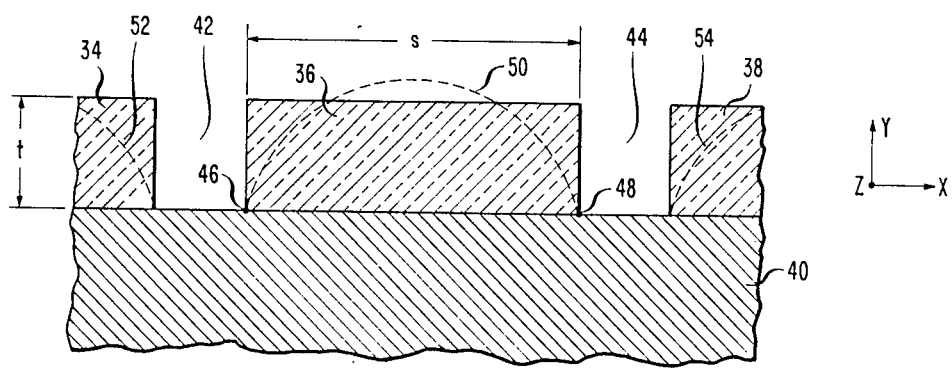
FIG. 2 represents in simplified form, for a given glass thickness, a portion of a VLSI device both before and after reflow.

A portion of the aforespecified glass layer included in the device structure of FIG. 1 is shown in simplified form in FIG. 2. For purposes of analysis and discussion, the apertured glass layer 26 of FIG. 1 is represented in FIG. 2 as comprising infinitely long parallel rectangular slabs 34, 36 and 38 on a substrate 40. Openings 42 and 44 between adjacent slabs correspond approximately to two adjacent vertically walled vias in a device of the type shown in FIG. 1. Thus, the designations t (glass thickness) and s (via-to-via spacing) employed in FIG. 1 are also utilized in the simplified representation of FIG. 2.

The structures shown in FIGS. 1 and 2 are each characterized by an aspect ratio defined as t/s. For the particular structure illustrated in FIG. 2, this ratio has a value of about 0.2.

Due to the action of surface tension forces, reflow of the glass portions shown in FIG. 2 produces a viscous movement of the glass material. More specifically, viscous flow occurs to produce minimum-energy configurations.

In typical VLSI device fabrication sequences, the lines of contact between the glass portions and the underlying structure do not move during reflow. (In FIG. 2, these contact lines include Z-direction lines 46 and 48.) Moreover, the volume of glass remains constant during reflow. Therefore, it is seen that a constant curvature of the reflowed glass material will represent a minimum free surface area and therefore also has a minimum-energy stable configuration. Such a stable configuration at equilibrium, for the particular case of an aspect ratio of approximately 0.2, is represented in FIG. 2 by dash line 50. And, assuming that the glass portions 34 and 38 of FIG. 2 have the same X-direction extent as the portion 36, the portions 34 and 38 will be similarly reconfigured during reflow, as respectively indicated by dash lines 52 and 54.

In practice, it is considerably easier to apply a conductive covering to the reflowed glass portions represented in FIG. 2 by dash lines 50, 52 and 54 than it is to achieve adequate coverage of the portions 34, 36 and 38. Thus, reflow usually facilitates the fabrication of VLSI devices.

However, as the via-to-via-equilvalent width s shown in FIG. 2 is decreased, a point is reached at which the equilibrium configuration of the reflowed glass exhibits an undesirable overhang condition. Such a condition is illustrated in FIG. 3 wherein the shapes of glass portions 56, 58 and 60 after reflow are represented by dash lines 57, 59 and 61, respectively.

Figure 3:
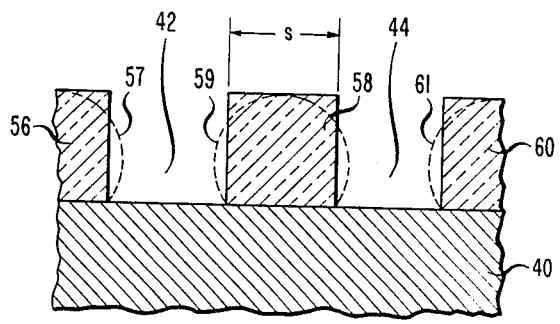
FIG. 3 illustrates, for the same glass thickness, the overhang problem that arises when vias are spaced too closely together.

The aspect ratio t/s of the glass structure depicted in FIG. 3 is approximately 0.9. It is apparent that the contours of the glass portions 56, 58 and 60 after reflow each include a significant overhang region. As seen in FIG. 3, these overhang or bulging portions each form a re-entrant angle at the bottoms of the openings 42 and 44.

Overhangs of the type represented in FIG. 3 considerably complicate the task of achieving reliable conductive connections in the openings 42 and 44. Additionally, overhangs extending to the contact lines can result in transverse forces at the contact lines that can lead to contact line movement. Such movement can cause a reduction in the area of the via or even closure of the via. Furthermore, in small-via devices, these bulging overhangs may actually touch each other and thereby cause closure of the vias. For these and other reasons, via overhangs are to be avoided in fabrication sequences aimed at achieving reliable low-cost VLSI devices.

Attempts by workers skilled in the art to make devices having glass layers with extremely small via-to-via spacings and no via overhangs have included various expedients. These have included altering the composition of the glass material and changing the parameters of the reflow step. But none of these attempts has been effective in practice to prevent the occurrence of via overhang in VLSI devices.

Applicants have discovered that sidewall overhang in vias will not occur after reflow if the aspect ratio t/s is maintained approximately at or below a critical value. Applicants have determined, based on the particular considerations specified later below, that this critical value is about 0.393. In other words, this value is the largest aspect ratio that does not result in a via overhang at equilibrium after reflow.

It is noted that even apertured glass layers whose aspect ratios are $\leq 0.393$ form via overhangs during reflow. In fact, every glass cross section passes through a temporary condition in which an overhang occurs and every glass cross section with an aspect ratio of less than 0.5 passes through a temporary condition in which this overhang extends down to the contact line. The extent of this latter overhang is about 0.066 times the glass thickness. But, significantly, for glass layers whose aspect ratios are $\leq 0.393$, the overhang disappears completely by the time viscous flow produces the aforedescribed equilibrium minimum-energy shape.

Figure 4:
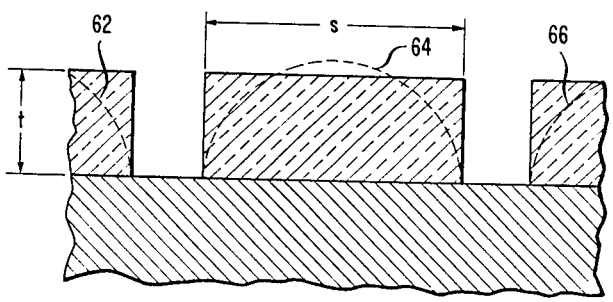
FIG. 4 shows, for the same glass thickness, the closest via-to-via spacing that can be achieved without overhang.

FIG. 4 shows another simplified structure of the type depicted in FIGS. 2 and 3. For comparison purposes, the thickness t of the apertured glass layer in each of FIGS. 2 through 4 is assumed to be the same. As previously discussed, the equivalent via-to-via spacing in FIG. 2 is sufficiently large that no via overhang exists at equilibrium after reflow. By contrast, in FIG. 3 the equivalent via-to-via spacing is so small that unacceptable via overhang does exist at equilibrium after reflow.

As indicated in the paragraph immediately below, the aspect ratio t/s of the particular structure shown in FIG. 4 is approximately 0.393. Thus, FIG. 4 represents in effect the closest equivalent via-to-via spacing that can be achieved in a particular glass thickness without causing via overhang at equilibrium after reflow. The contours of the reflowed glass portions are indicated by dash lines 62, 64 and 66 in FIG. 4.

In the particular structure shown in FIG. 4, the cross-sectional area of the semicircle indicated by the dash line 64 is $\frac{1}{2}\pi(s/2)^2$. In this limiting case for no overhang, with right angles at the aforespecified contact lines, this area is equal to the cross-sectional area (s.t) of the glass before reflow. The aspect ratio t/s for this specific case is therefore $\pi/8$ or 0.393.

The simplified structure shown in FIG. 4 is consistent with observations made on actual VLSI devices. Thus, for example, in devices having a one-micrometer ($\mu$m)-thick glass layer with a 2.5-$\mu$m via-to-via spacing (aspect ratio=0.4), acceptable glass contours of the very type illustrated in FIG. 4 are in fact obtained at equilibrium after reflow.

On the other hand, in actual devices having a 1-$\mu$m-thick glass layer with a via-to-via spacing of only about 1.1 $\mu$m (aspect ratio=0.9), unacceptable glass contours of the type shown in FIG. 3 are obtained at equilibrium after reflow.

Figure 5:
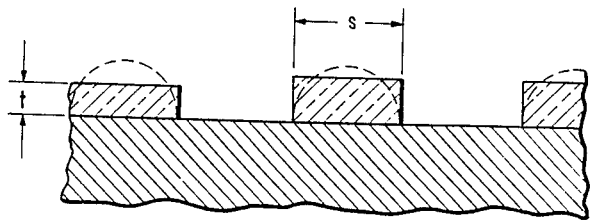
FIG. 5 represents a portion of a VLSI device modified in accordance with the present invention to achieve, without overhang, via-to-via spacing of the dimension illustrated in FIG. 3.

In accordance with the principles of the present invention, otherwise unacceptably small via-to-via spacings are achieved in VLSI devices without the occurrence of via overhangs at equilibrium after reflow. This is illustrated in FIG. 5 wherein the via-to-via spacing s is assumed to be equal to the spacing s shown in FIG. 3. But, in the FIG. 5 structure, the thickness t of the depicted glass layer has been purposely reduced to achieve an aspect ratio t/s approximately $\leq 0.393$.

Thus, for example, assume that the via-to-via spacing s shown in FIG. 5 is about 1.25 $\mu$m. If the thickness t of the glass layer were maintained at the previously specified illustrative value of 1 $\mu$m, the aspect ratio of the structure would be 0.8. But, based on the discussion and analysis above, it is apparent that such a structure with an aspect ratio of 0.8 would include unacceptable via overhangs at equilibrium after reflow.

In accordance with applicants' invention, a structure acceptable for a VLSI device having via-to-via spacings of only 1.25 $\mu$m is obtained by reducing the glass thickness t to a value such that t/s $\leq 0.393$. Thus, for example, if t is established at 0.5 $\mu$m, the aspect ratio of the resulting structure is seen to be 0.4 which in practice is acceptable. Such a structure with a reduced glass thickness relative to the thicknesses represented in FIGS. 2 through 4 is illustrated in FIG. 5.

The necessity to reduce glass thickness in a VLSI device to achieve specified via-to-via spacings, in the manner taught by applicants, may require in practice a proportional reduction in the height of the gate electrode. Thus, by way of a specific illustrative example, and referring to FIG. 1, as the thickness t of the glass layer 26 is reduced to 0.5 $\mu$m to achieve the aforespecified via-to-via spacing of 1.25 $\mu$m, it is necessary in practice to reduce the thickness of the depicted gate electrode from typical values employed in such devices. For example, the thickness of the conductive layer 16 may have to be reduced to about 0.2 $\mu$m (from a more conventional value of about 0.3 $\mu$m), and the thickness of the doped polysilicon layer 18 may have to be reduced to about 0.1 $\mu$m (from a more conventional value of about 0.3 $\mu$m), An overlying 0.5-$\mu$m-thick layer of glass will provide adequate coverage of such a reduced-height gate electrode.

Finally, it is to be understood that the above-described arrangements and techniques are only illustrative of the principles of the present invention. In accordance with these principles, numerous modifications and alternatives may be devised by those skilled in the art without departing from the spirit and scope of the invention.

What is claimed is:

1. A microminiature device comprising
   a dielectric layer made of a reflowable mateiral,
   spaced-apart vias in said layer, said vias having no overhangs therein at equilibrium after reflow, the smallest spacing s between vias being approximately $\leq 1.75$ $\mu$m,
   wherein t is the maximum thickness of any of the walls defining said vias in said layer,
   and wherein t/s is approximately $\leq 0.393$.

2. A device as in claim 1 wherein said reflowable material comprises glass.

3. A device as in claim 2 wherein said reflowable glass is selected from the group consisting of phosphosilicate glass, borophosphosilicate glass, germanophosphosilicate glass and arsenophosphosilicate glass.

4. A device as in claim 1 further including a gate electrode underlying said layer, at least one of the vias in said layer exposing a portion of the top surface of said gate electrode.

5. A device as in claim 4 wherein said gate electrode comprises a metallic layer.

6. A device as in claim 5 wherein the thickness t of said dielectric layer sufficiently exceeds the thickness of said gate electrode to provide effective insulating coverage thereof.

* * * * *